United States Patent
Gao et al.

(10) Patent No.: US 10,355,702 B2
(45) Date of Patent: Jul. 16, 2019

(54) HYBRID PHASE-LOCKED LOOP

(71) Applicant: QUALCOMM Incorporated, San Diego, CA (US)

(72) Inventors: Zhuo Gao, Cary, NC (US); Bupesh Pandita, Raleigh, NC (US); Eskinder Hailu, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 118 days.

(21) Appl. No.: 15/653,445

(22) Filed: Jul. 18, 2017

(65) Prior Publication Data

US 2019/0028108 A1    Jan. 24, 2019

(51) Int. Cl.
| | | |
|---|---|---|
| H03L 7/089 | (2006.01) | |
| H03D 3/24 | (2006.01) | |
| H03L 7/093 | (2006.01) | |
| H03L 7/099 | (2006.01) | |
| H03L 7/18 | (2006.01) | |

(52) U.S. Cl.
CPC ............ *H03L 7/0891* (2013.01); *H03D 3/24* (2013.01); *H03L 7/093* (2013.01); *H03L 7/0991* (2013.01); *H03L 7/18* (2013.01); *H03L 7/0995* (2013.01)

(58) Field of Classification Search
CPC ...................................................... H03L 7/0891
USPC ............................................................ 331/25
See application file for complete search history.

(56) References Cited

U.S. PATENT DOCUMENTS

| | | | |
|---|---|---|---|
| 7,177,611 B2 | 2/2007 | Goldman et al. | |
| 8,390,347 B1 | 3/2013 | Sinha et al. | |
| 8,704,567 B2 | 4/2014 | Ainspan et al. | |
| 8,878,614 B2 | 11/2014 | Yin et al. | |
| 8,952,759 B2 | 2/2015 | Wang et al. | |
| 9,344,271 B1 | 5/2016 | Dusatko | |
| 9,608,646 B2 | 3/2017 | Hiraku et al. | |
| 2006/0009184 A1* | 1/2006 | Goldman | H03L 7/093 455/260 |
| 2008/0080656 A1* | 4/2008 | Wilson | H03L 7/091 375/376 |
| 2011/0133799 A1 | 6/2011 | Dunworth et al. | |

OTHER PUBLICATIONS

International Search Report and Written Opinion—PCT/US2018/039353—ISA/EPO—dated Oct. 4, 2018.

* cited by examiner

*Primary Examiner* — Joseph Chang
(74) *Attorney, Agent, or Firm* — Haynes and Boone, LLP

(57) ABSTRACT

A hybrid PLL is provided that includes an digital integral path and an analog proportional path.

18 Claims, 5 Drawing Sheets

US 10,355,702 B2

HYBRID PHASE-LOCKED LOOP

TECHNICAL FIELD

This application relates to a phase-locked loop, and more particularly to a hybrid phase-locked loop having a digital integral path and an analog proportional path.

BACKGROUND

A traditional phase-locked loop (PLL) used an analog, charge-pump-based design. In an analog PLL, the PLL output signal is divided down in frequency to form a feedback signal. A phase detector pulses an up or a down signal proportionally to a phase difference between the feedback signal and a reference signal. A charge pump responds to the pulsing of the up and down signals to either charge or decrease a control signal such as a control voltage, which is then filtered in a loop filter. A VCO responds to the filtered control voltage to drive the PLL output signal. The resulting feedback keeps the PLL output signal phase aligned with the reference signal. But such an analog design requires relatively large capacitors that are implemented using the metal layers adjacent the integrated circuit die. An analog PLL thus consumes a relatively large amount of die space. The relatively large capacitance also increases the time-to-lock. Moreover, analog designs are difficult to port from one process technology node to another.

Digital PLLs have thus been developed in which the phase detector output is converted to a digital number that is proportional to the phase difference between the reference signal and the feedback signal. The digital number resulting from the phase comparison is digitally filtered to provide a filtered digital signal that is converted into an analog signal such as a control current for driving a current-controlled oscillator (CCO). Alternatively, a control voltage may be produced. The resulting output signal from the oscillator forms the PLL output signal. A digital PLL thus does not require a charge pump or an analog filter. The relatively large capacitors necessary for these analog components are thus unnecessary in a digital PLL, which increases density. Moreover, a digital PLL does not suffer from the process variations for the RC components in the charge pump and analog loop filter. In addition, a digital PLL has faster lock time and may be readily ported across technology nodes. The digital filter parameters for a digital PLL are also readily adjusted to accommodate design changes.

Although a digital PLL thus has advantageous properties with regard to a traditional analog PLL, challenges remain in digital PLL design. For example, a digital PLL requires a time-to-digital converter (TDC) circuit to perform the quantization of the phase detector output signals. But the quantization by the TDC circuit results in undesirable spurs such that the TDC circuit requires pico-second accuracy to minimize the phase noise for the PLL output signal. In addition, the delay elements in the TDC circuit are subject to undesirable process variations.

Accordingly, there is a need in the art for improved PLL architectures.

SUMMARY

A hybrid PLL is provided that includes an analog proportional path and a digital integral path. To reduce the frequency resolution requirements for an arbiter in a time-to-digital converter within the digital integral path, the time-to-digital converter is configured to offset its time-to-digital code output in some embodiments. Alternatively, the arbiter resolution may be increased by inverting an up signal in a first inverter to drive an input of a first NAND gate in a cross-coupled pair of NAND gates within the arbiter. A second inverter inverts a down signal to drive an input of a second NAND gate in the cross-coupled pair of NAND gates. The input to the first NAND gate controls a switch transistor connected between a ground node for the second inverter and ground. Similarly, the input to the second NAND controls another switch transistor connected between a ground node for the first inverter and ground.

These and other advantageous features may be better appreciated through the following detailed description.

DETAILED DESCRIPTION

A PLL is disclosed that enjoys the advantages of analog and digital approaches without their drawbacks. The resulting PLL includes a TDC circuit that digitizes the phase detector output into a digital word that is filtered by a digital filter. But the digital filter only implements an integral path within the PLL. A proportional path within the PLL does not pass through the TDC and the digital filter. The proportional path is thus an analog proportional path whereas the integral path is a digital path such that the resulting PLL is a hybrid, having both digital and analog paths. The placement of the proportional path within the analog side of the PLL is quite advantageous because the conventionally stringent resolution demands on the TDC circuit are relaxed. Moreover, having only the integral path within the digital portion makes the resulting PLL less susceptible to process variations from delay elements within the TDC circuit.

Figure 1:
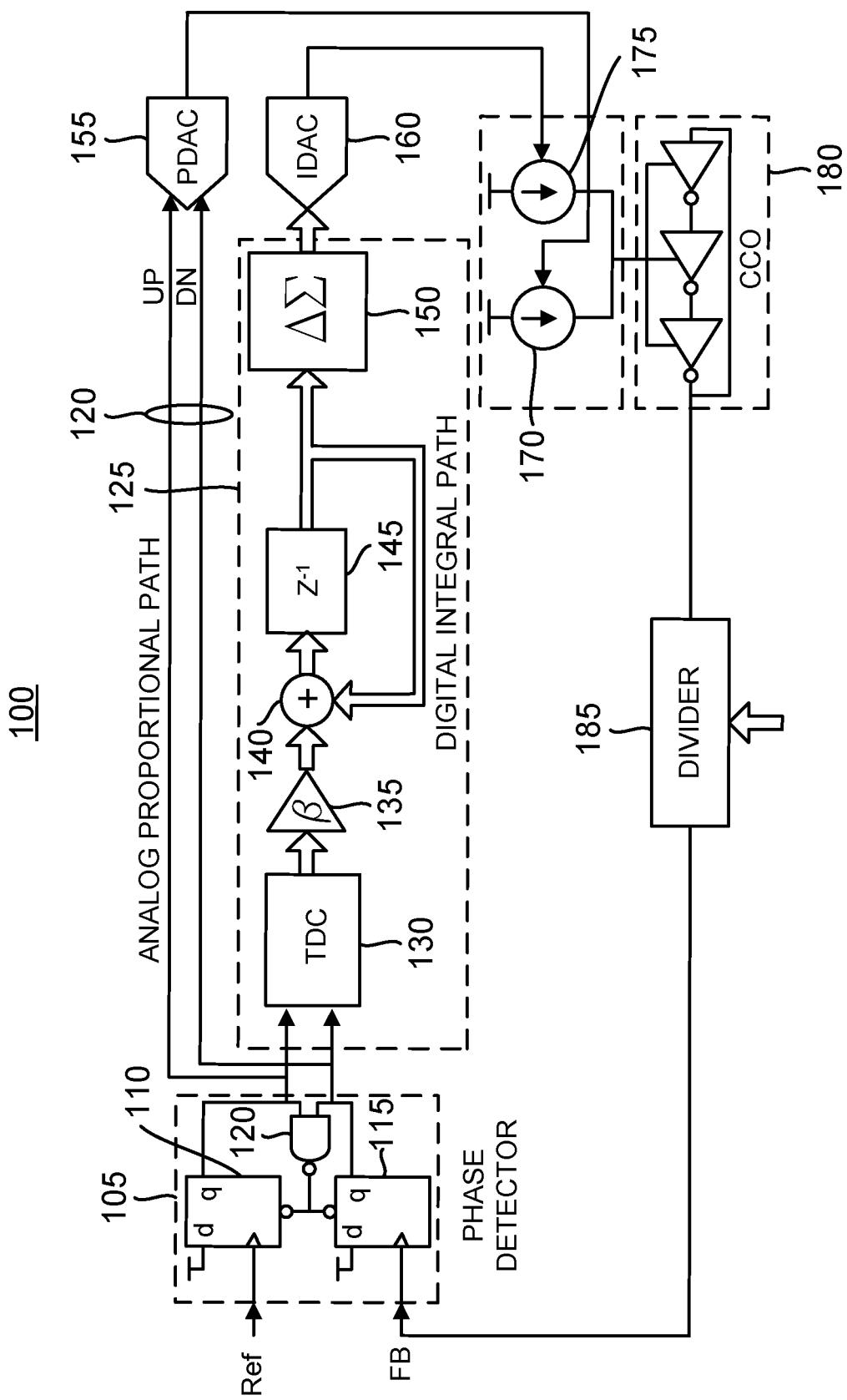
FIG. 1 illustrates a hybrid PLL in accordance with an aspect of the disclosure.

An example hybrid PLL 100 is shown in FIG. 1. A phase detector 105 includes a flip-flop 110 that is clocked by the reference (Ref) signal. The Q output signal from flip-flop 110 forms the up (UP) output signal from phase detector 105. The up signal will thus be asserted in response to the rising edge of the reference signal. Similarly, a feedback signal (FB) clocks a flip-flop 115. The Q output signal from flip-flop 110 forms the down (DN) output signal from phase detector 105. The down signal will thus be asserted in response to the rising edge of the feedback signal. A NAND gate resets flip-flops 110 and 115 to reset the up and down signals when both the up and down signals are asserted.

A time-to-digital converter (TDC) 130 within a digital integral path 125 for PLL 100 converts the delay between the rising edges for the up and the down signals into a digital code that is multiplied with a coefficient 13 in a multiplier 135. Multiplier 135 may be a digital multiplier or may be restricted to powers-of-two integer shifts. The output signal from multiplier 135 is added with a delayed version of the multiplier output signal from a digital delay element 145 in an adder 140. Digital delay element 145 thus produces an integrated digital output signal. Multiplier 135, adder 140, and digital delay element 145 may be deemed to form a digital filter that integrates the digital code from TDC 130 into an integrated digital code. To increase the frequency resolution for an integral path digital-to-analog converter (IDAC) 160, the integrated digital code from digital delay element 145 is delta-sigma modulated in a delta-sigma (ΔΣ) modulator 150 to produce a modulated digital output signal from digital integral path 125. IDAC 160 converts the modulated digital output signal from digital integral path 125 into an analog integral control signal that controls the current from a current source 175. The resulting current from current source 175 controls the oscillation by a current-controlled oscillator 180 that produces the output signal for PLL 100. A divider 185 divides the frequency for the output signal for PLL 100 to produce the feedback signal received by phase detector 105. The resulting feedback through digital integral path 125 maintains the frequency tracking for the PLL output signal with respect to the reference signal. But instantaneous tracking is provided by an analog proportional path 120 as formed by the up and down signals as received by a proportional path digital-to-analog converter (PDAC) 155.

With regard to the up and down signals, there are three possible combinations since they are reset whenever both are high. Thus, the two signals may both be binary zeroes. Alternatively, one may be a binary one whereas the other is a binary zero. Both PDAC 155 and IDAC 160 include a plurality of DAC segments (not illustrated), each DAC segment being configured to produce a current. PDAC 155 may thus be configured such that no segments are switched on so as to produce no current in response to the down signal equaling a binary one while the up signal equals a binary zero. In response to both the up and down signals equaling a binary zero, PDAC 155 may turn on a mid-level number of segments to produce a mid-level current. Should the up signal equal one while the down signal equals zero, PDAC 155 switches on twice the number of mid-level segments to produce a maximum current. The resulting current from PDAC 155 controls a current source 170 for driving current-controlled oscillator (CCO) 180 accordingly. In one embodiment, multiplier 135, adder 140, digital delay element 145, and IDAC 160 may be deemed to form a means for integrating and converting a digital code from TDC 130 to produce an analog integral control signal for controlling an oscillator such as CCO 180. Note that a voltage-controlled oscillator may be used in alternative embodiments.

Figure 2:
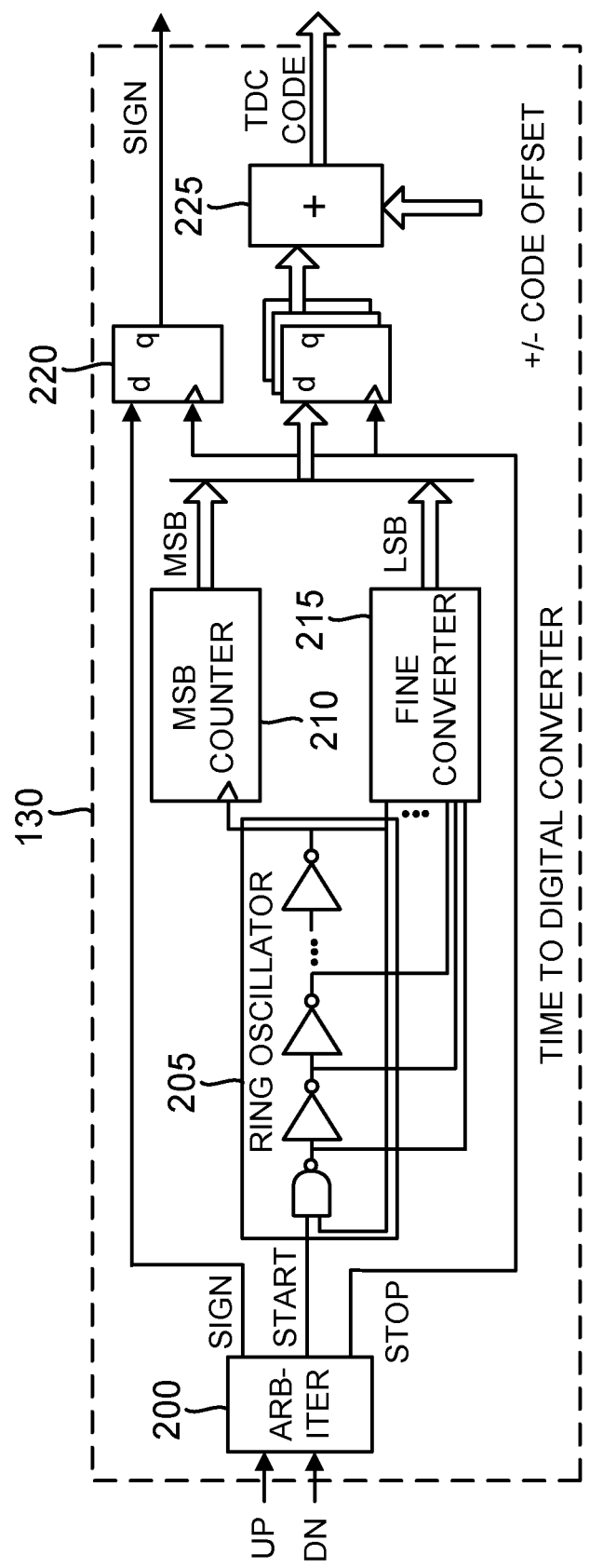
FIG. 2 illustrates the time-to-digital converter for the hybrid PLL of FIG. 1 in accordance with an aspect of the disclosure.

Due to the removal of the proportional path from the digital portion of PLL 100, the design requirements for TDC circuit 130 are advantageously relaxed. An example TDC circuit 130 is shown in greater detail in FIG. 2. An arbiter 200 receives the up and down signals to produce a sign, start, and stop signal. An example arbiter 200 is shown in more detail in FIG. 3. A NAND gate 300 NANDs the down signal with an inverted version of the up signal. An output of NAND gate 300 will thus go high when the up signal equals a binary one while the down signal equals a binary zero. A second NAND gate 305 NANDs the output signal from NAND gate 300 with the sign signal, which is produced by a third NAND gate 315. NAND gates 305 and 315 are cross-coupled such that the output from NAND gate 305 forms an input to NAND gate 315. A fourth NAND gate 310 NANDs the up signal with an inverted version of the down signal. An output of NAND gate 310 will thus go high when the down signal equals a binary one while the up signal equals a binary zero. NAND gate 315 NANDs the outputs from NAND gates 310 and 305.

Suppose that the up signal and down signals are both zeroes. The outputs of NAND gates 300 and 310 will then be binary ones such that the sign signal will retain its state. For example, if the sign signal had been equal to one prior to the transition of the up and down signals to zero, the output of NAND gate 305 is zero, which does not affect the high state for the sign signal as produced by NAND gate 315. Similarly, if the sign signal had been equal to zero prior to the transition of the up and down signals to zero, the output of NAND gate 305 will be a one such that NAND gate 315 maintains the sign signal low. In contrast to the sign signal, the start signal is produced by an OR gate 320 that ORs the up and down signals. The start signal will thus be asserted whenever the up signal and/or the down signals are high. In addition, an AND gate 325 ANDs the up and down signals to produce the stop signal. The stop signal will thus go high only when the up and down signals are both asserted.

Figure 3:
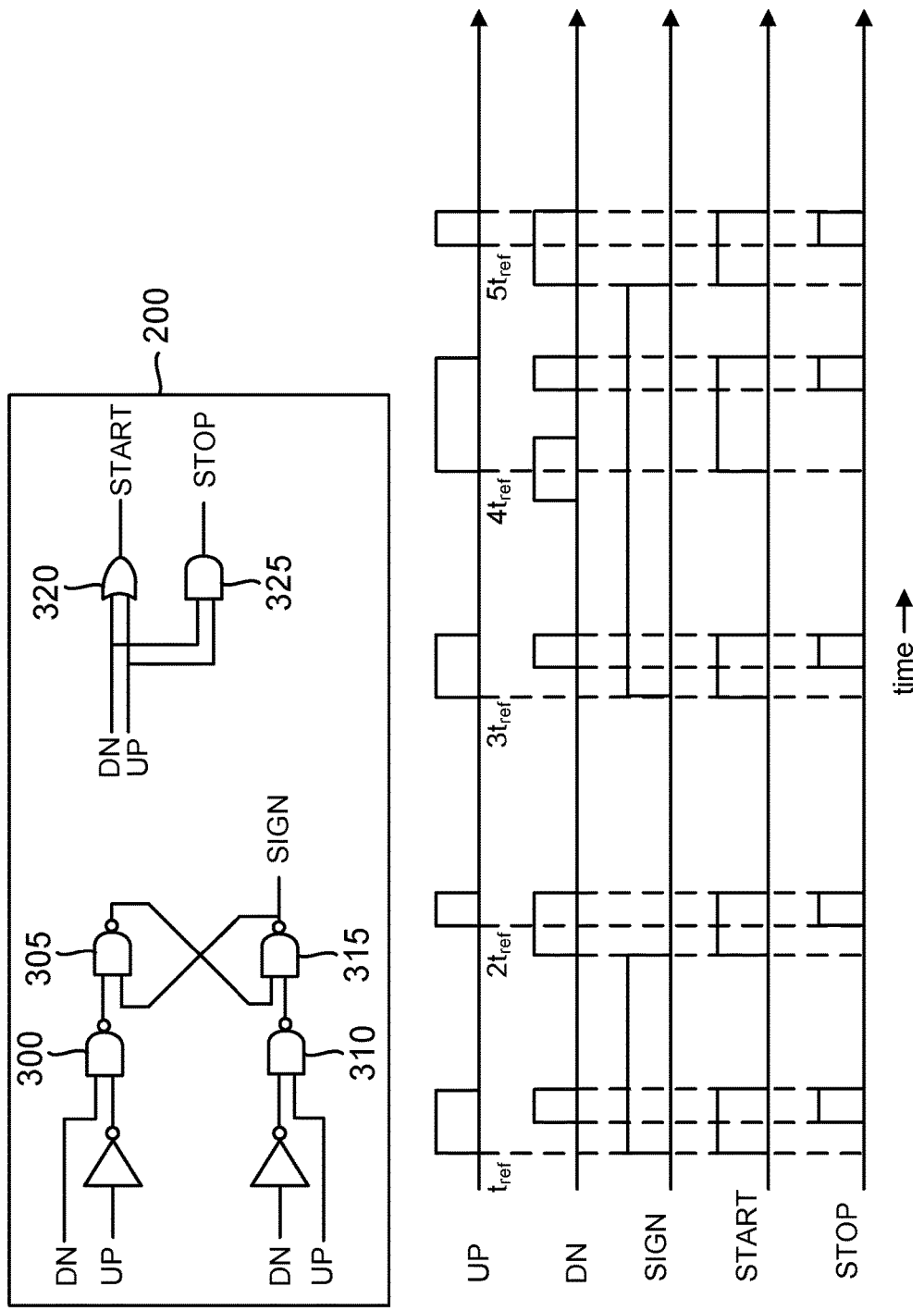
FIG. 3 illustrates an arbiter and its waveforms for the time-to-digital converter of FIG. 2 in accordance with an aspect of the disclosure.

The resulting behavior of the sign, start, and stop signals in response to the up and down signals is also shown in FIG. 3. The up signal is asserted at times $t_{ref}$, $2T_{ref}$, $3T_{ref}$, $4T_{ref}$, and $5T_{ref}$. Since the up signal leads the down signal at time $t_{ref}$, the sign signal is asserted at that time. Similarly, the start signal is also asserted at time $t_{ref}$. At the rising edge of the down signal following time $t_{ref}$, the stop signal is asserted. Both the stop and start signals fall at the falling edges of the up and down signals.

The sign signal remains high until just before time $t_{ref2}$. The down signal is then leading the up signal such that the sign signal is brought low. The start signal is then asserted simultaneously with the rising edge for the down signal. Finally, both the start and stop signals are de-asserted at the falling edges for the up and down signals just after the time $2t_{ref}$. The sign signal then stays low until the rising edge of the up signal at time $3t_{ref}$. Since the up signal is leading the down signal at time $3t_{ref}$, the sign signal is asserted. The start signal is also asserted at time $3t_{ref}$. Shortly after time $3t_{ref}$, the stop signal is asserted in response to the rising edge of the down signal. Both the stop and start signals are then de-asserted at the falling edges of the up and down signal. The sign signal remains high following time $4t_{ref}$ since the up signal still leads the down signal at that time. It is not until slightly before time $5t_{ref}$ that the down signal leads the up signal. The sign signal is thus brought low in response to the rising edge of the down signal at that time.

Although arbiter 200 is advantageously simple such that it just needs a few logic gates to produce the sign, start, and stop signals, its performance suffers when the up and down signal rising edges are relatively close such as within 30 picoseconds or less of each other due to imbalances within the transistors forming arbiter 200. Referring again to FIG. 2, TDC circuit 130 is still able to discriminate between such relatively close rising edges as will be explained further herein. The start signal triggers a ring oscillator 205 to being oscillating. The resulting oscillations at an output of ring oscillator 205 trigger a most significant bit (MSB) counter 210 to count the MSB portion of a TDC signal. A fine converter 215 receives the various taps from ring oscillator 205 to count the LSB portion of the TDC signal. The TDC signal bits are registered in corresponding flip-flops responsive to the rising edge of the stop signal. Similarly, the rising edge of the stop signal triggers a flip-flop 220 to register the sign signal. In addition, the rising edge of the stop signal stops the oscillation by ring oscillator 205. The TDC signal is then added with a code offset (which may be positive or negative) in an adder 225 to produce the TDC output signal (also denoted as the TDC code). The resulting offset to the TDC code is quite advantageous with regard to addressing the relatively coarse resolution of arbiter 200 discussed above. In particular, the rising edges of the up and down signals are adequately separated by the code offset such that arbiter 200 has no trouble resolving which signal has the initial rising edge.

Figure 4:
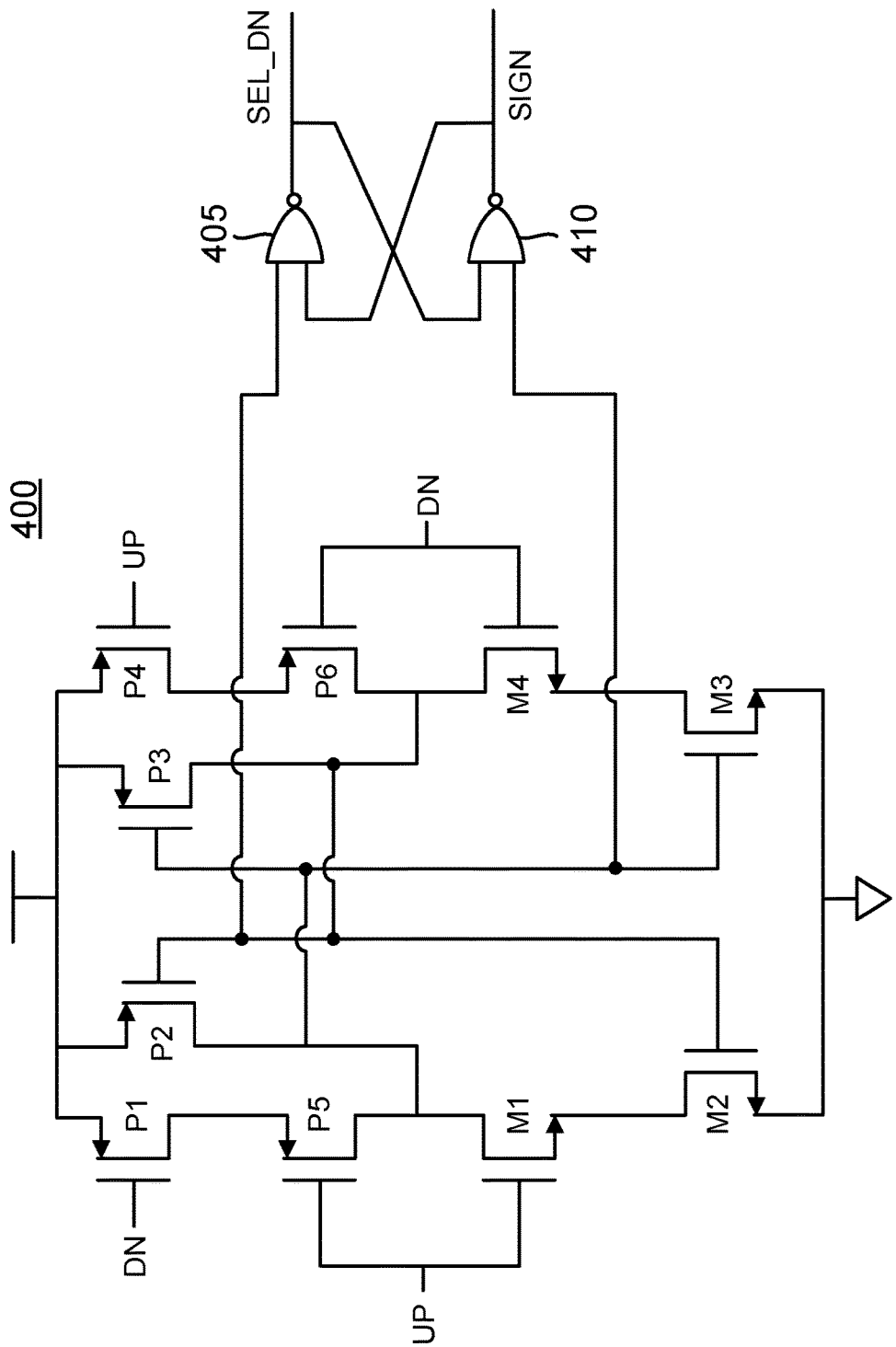
FIG. 4 illustrates a portion of an arbiter with improved frequency resolution in accordance with an aspect of the disclosure.

Although TDC circuit 130 may operate with sufficient accuracy despite the relative coarse resolution of arbiter 200, a more refined arbiter 400 as shown in FIG. 4 may replace arbiter 200 in alternative embodiments of PLL 100. The generation of the start and stop signals remains the same as discussed with regard to arbiter 200 and is thus not shown in FIG. 4. A pair of cross-coupled NAND gates 405 and 410 function to latch the sign signal in FIG. 4 analogously as discussed with regard to cross-coupled NAND gates 305 and 315 of FIG. 3. Suppose that the up and down signal were both low. The up signal drives an input of an inverter formed by a PMOS transistor P5 and an NMOS transistor M1. The source of transistor P5 connects to a power supply node through a PMOS transistor P1 having its gate driven by the down signal. The drain of transistor P5 will thus be charged to the power supply voltage while the up and down signals are both low. Similarly, the down signal drives the input of an inverter formed by a PMOS transistor P6 and an NMOS transistor M4. The source of transistor P6 connects to a power supply node through a PMOS transistor P4 having its gate driven by the up signal. The drain of transistor P6 will thus be charged to the power supply voltage while the up and down signals are both low. The drain of transistor P5 drives an input of NAND gate 410 whereas the drain of transistor P6 drives an input of NAND gate 405. Cross-coupled NAND gates 405 and 410 will thus retain the state of the sign signal prior to the low transition of both the up and down signals analogously as discussed with regard to cross-coupled NAND gates 305 and 315.

The drain of transistor P5 connects to a gate of an NMOS transistor M3 that connects between ground and a source for transistor M4 (note that this source is a ground node for the inverter formed by transistors M4 and P6). Similarly, the drain of transistor P6 connects to a gate of an NMOS transistor M2 that connects between ground and a source for transistor M1 (this source being a ground node for the inverter formed by transistors M1 and P5). Both transistors M2 and M3 will thus be switched on while the up and down signal are low such that the sources of transistors M1 and M4 are grounded at that time. Suppose that the sign signal was low. The output of NAND gate 405 (designated as SEL_DN) will then be high. Should the up signal then transition high while the down signal remains low, transistor M1 will switch on to discharge the drain of transistor P5. NAND gate 410 then receives a zero such that it drives the sign signal high. The drain of transistor P5 also drives a gate of a PMOS transistor P3 connected between the power supply node and a the drain of transistor P6. The discharge of the drain of transistor P5 thus switches on transistor P3 to maintain the drain of transistor P6 high even though transistor P4 switches off in response to the high state for the up signal. A subsequent rising edge for the down signal cannot change the state of the sign signal since the switching off of transistor M3 prevents transistor M4 from discharging the drain of transistor P6. The up and down signal will eventually both be low such that the drains of transistors P5 and P6 are charged again to the power supply voltage.

Should the down signal then transition high before another rising edge of the up signal, transistor M4 will switch on to discharge the drain of transistor P6. This discharge switches on a PMOS transistor P2 to maintain the charged state for the drain of transistor P5. The input to NAND gate 410 thus remains high. But the discharge of the drain of transistor P6 causes the input to NAND gate 405 to be discharged. The output of NAND gate 405 thus goes high. Since NAND gate 410 would then be receiving two ones, the sign signal goes low as is proper in the case of the down signal leading the up signal. The discharge of the drain of transistor P6 causes transistor M2 to shut off. Thus, a subsequent rising edge of the up signal cannot change the charged state for the drain of transistor P5 such that the sign signal remains low. Eventually both the up and down signals will transition low such that transistors P1, P5, P4 and P6 are switched on to maintain the default charged state for the drains of transistors P5 and P6.

Figure 5:
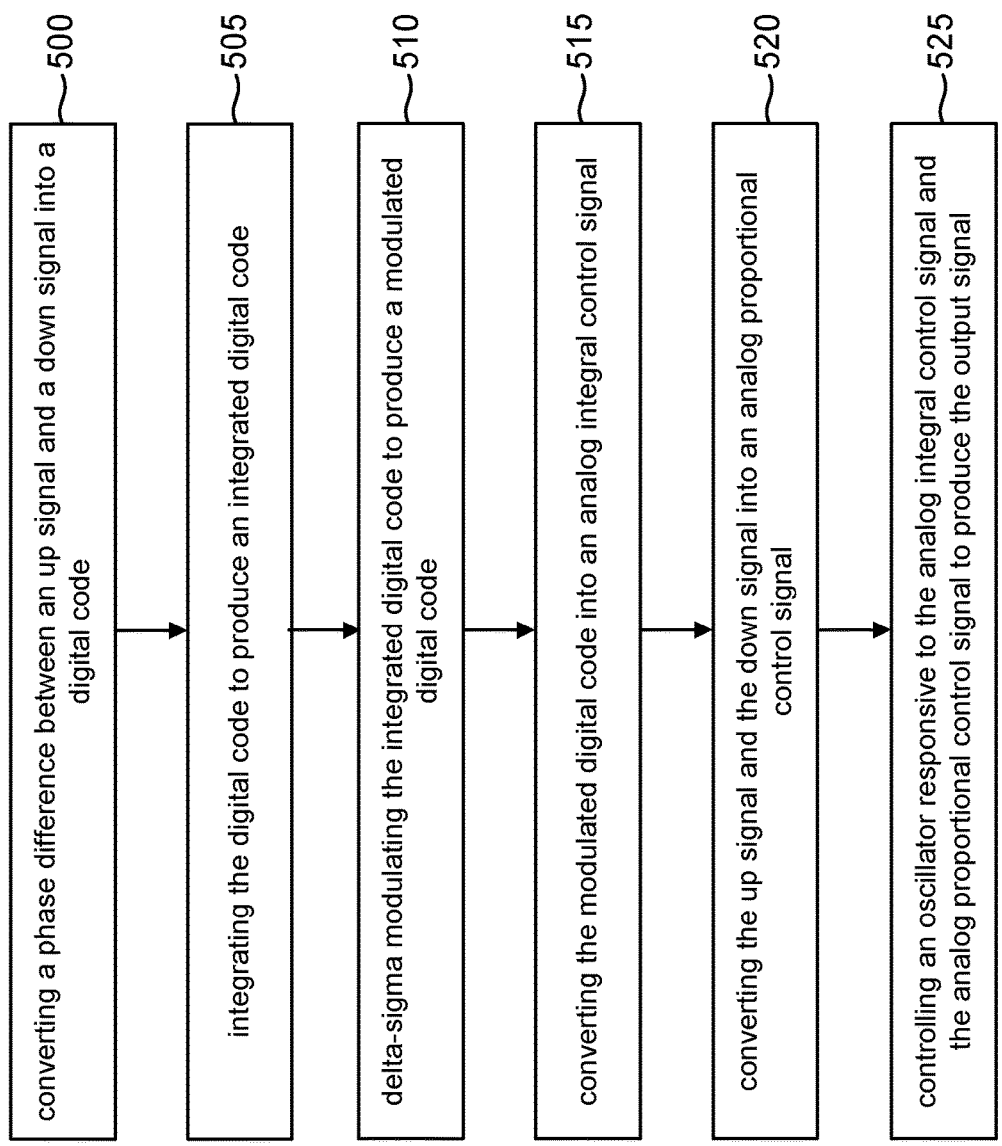
FIG. 5 is a flowchart for an example method of operation for a hybrid PLL in accordance with an aspect of the disclosure.

A method of operation of a hybrid PLL will now be discussed with reference to the flowchart of FIG. 5. The method includes an act 500 of converting a phase difference between an up signal and a down signal into a digital code. The performance of TDC 130 of as discussed with regard to FIG. 1 is an example of act 500. The method also includes an act 505 of integrating the digital code to produce an integrated digital code. The multiplication of the TDC output in multiplier 135, addition in adder 140, and delay in delay element 145 is an example of act 505. In addition, the method further includes an act 510 of delta-sigma modulating the integrated digital code to produce a modulated digital code. The modulation within delta-sigma modulator 150 is an example of act 510. Furthermore, the method includes an act 515 of converting the modulated digital code into an analog integral control signal. The analog conversion in IDAC 160 is an example of act 515. In addition, the method includes an act 520 of converting the up signal and the down signal into an analog proportional control signal. The conversion in PDAC 155 is an example of act 520. Finally, the method includes an act 525 of controlling an oscillator responsive to the analog integral control signal and the analog proportional control signal to produce the output signal. The control of CCO 180 is an example of act 525.

It will thus be appreciated that many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A phase-locked loop (PLL), comprising:
    a phase detector configured to assert an up signal in response to a reference signal leading a feedback signal and to assert a down signal in response to the feedback signal leading the reference signal;
    a time-to-digital converter configured to convert a phase difference between the assertion of the up signal and the assertion of the down signal into a digital code, wherein the time-to-digital converter includes an arbiter that produces a sign signal, a start signal, and a stop signal responsive to the phase difference between the assertion of the up signal and the assertion of the down signal;

a digital filter configured to integrate the digital code into an integrated digital code;
a delta-sigma modulator configured to modulate the integrated digital code into a modulated digital code;
an integral digital-to-analog converter configured to convert the modulated digital code into an analog integral control signal;
a proportional digital-to-analog converter configured to convert the up signal and the down signal into an analog proportional control signal; and
an oscillator configured to produce a PLL output signal responsive to the analog proportional control signal and to the analog integral control signal.

2. The PLL of claim 1, further comprising;
a frequency divider configured to divide the PLL output signal to produce the feedback signal.

3. The PLL of claim 1, wherein the time-to-digital converter includes a ring oscillator configured to oscillate responsive to an assertion of the start signal and to stop oscillating responsive to an assertion of the stop signal.

4. The PLL of claim 3, wherein the time-to-digital converter includes a set of registers configured to register a digital word responsive to the oscillation of the oscillator, and wherein the time-to-digital converter is configured to offset the digital word by an offset to form the digital code.

5. The PLL of claim 4, wherein the offset is a positive offset.

6. The PLL of claim 1, wherein the arbiter includes a cross-coupled pair of NAND gates configured to latch the sign signal.

7. The PLL of claim 6, wherein the arbiter includes a first inverter configured to invert the up signal into an input signal for a first NAND gate in the cross-coupled pair of NAND gates, and wherein the arbiter further includes a second inverter configured to invert the down signal into an input signal for a second NAND gate in the cross-coupled pair of NAND gates.

8. The PLL of claim 7, wherein the input signal to the first NAND gate drives a gate of a first NMOS transistor coupled between a ground node for the first inverter and ground.

9. The PLL of claim 8, wherein the input signal to the second NAND gate drives a gate of a second NMOS transistor coupled between a ground node for the first inverter and ground.

10. The PLL of claim 6, wherein the arbiter includes a third NAND gate configured to NAND the down signal with an inverted version of the up signal, and wherein an output of the third NAND gate is connected to an input for a first NAND gate in the cross-coupled pair of NAND gates.

11. The PLL of claim 10, wherein the arbiter further includes a fourth NAND gate configured to NAND the up signal with an inverted version of the down signal, and wherein an output of the fourth NAND gate is connected to an input for a second NAND gate in the cross-coupled pair of NAND gates.

12. The PLL of claim 6, wherein the arbiter further includes an OR gate configured to OR the up signal with the down signal to produce the start signal, and wherein the arbiter further includes an AND gate configured to AND the up signal with the down signal to produce the stop signal.

13. A method of phase-locking an output signal to a reference signal, comprising;
converting a phase difference between an up signal and a down signal into a digital code, wherein converting the phase difference between the up signal and the down signal comprises: converting the phase difference into a digital word; and offsetting the digital word by an offset to produce the digital code;
integrating the digital code to produce an integrated digital code;
delta-sigma modulating the integrated digital code to produce a modulated digital code;
converting the modulated digital code into an analog integral control signal;
converting the up signal and the down signal into an analog proportional control signal;
controlling an oscillator responsive to the analog integral control signal and the analog proportional control signal to produce the output signal.

14. The method of claim 13, further comprising:
dividing the output signal in frequency to produce a divided signal;
asserting the up signal responsive to the reference signal leading the divided signal; and
asserting the down signal responsive to the divided signal leading the reference signal.

15. The method of claim 13, further comprising:
asserting a sign signal responsive to whether the up signal leads the down signal, wherein a positive or negative sign of the digital code equals the sign signal.

16. A phase-locked loop (PLL), comprising:
a phase detector configured to assert an up signal in response to a reference signal leading a feedback signal and to assert a down signal in response to the feedback signal leading the reference signal;
a time-to-digital converter configured to convert a phase difference between the assertion of the up signal and the assertion of the down signal into a digital word and to offset the digital word by an offset to produce a digital code;
means for integrating and converting the digital code to produce an analog integral control signal;
a proportional digital-to-analog converter configured to convert the up signal and the down signal into an analog proportional control signal;
a first current source configured to generate a first control current responsive to the analog integral control signal;
a second current source configured to generate a second control current responsive to the analog proportional control signal; and
a current-controlled oscillator configured to produce a PLL output signal responsive to the first control current and to the second control current.

17. The PLL of claim 16, wherein the time-to-digital converter further includes an arbiter configured to assert a sign signal responsive to whether the up signal leads the down signal.

18. The PLL of claim 17, wherein the time-to-digital converter includes a cross-coupled pair of NAND gates.

* * * * *